United States Patent
Ohsaka

(10) Patent No.: US 7,839,652 B2
(45) Date of Patent: Nov. 23, 2010

(54) SEMICONDUCTOR DEVICE AND PRINTED CIRCUIT BOARD

(75) Inventor: Tohru Ohsaka, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 12/255,789

(22) Filed: Oct. 22, 2008

(65) Prior Publication Data

US 2009/0051015 A1   Feb. 26, 2009

Related U.S. Application Data

(62) Division of application No. 11/960,161, filed on Dec. 19, 2007, now Pat. No. 7,495,928, which is a division of application No. 11/094,136, filed on Mar. 31, 2005, now Pat. No. 7,349,224.

(30) Foreign Application Priority Data

Apr. 16, 2004 (JP) .............................. 2004-121434
Feb. 22, 2005 (JP) .............................. 2005-045617

(51) Int. Cl.
*H05K 7/10* (2006.01)
*H05K 7/12* (2006.01)

(52) U.S. Cl. .................... 361/767; 361/770; 361/774
(58) Field of Classification Search .......... 361/767–774
See application file for complete search history.

(56) References Cited

U.S. PATENT DOCUMENTS

| 6,403,895 | B1 | 6/2002 | Sota | 174/260 |
| 6,700,208 | B1 | 3/2004 | Yoneda | 257/779 |
| 6,800,814 | B2 | 10/2004 | Ohsaka | 174/255 |
| 6,812,580 | B1 | 11/2004 | Wenzel et al. | 257/784 |
| 7,259,467 | B2 | 8/2007 | Inagawa | 257/784 |

FOREIGN PATENT DOCUMENTS

JP   2001-110927   4/2001

*Primary Examiner*—Tuan T Dinh
(74) *Attorney, Agent, or Firm*—Fitzpatrick, Cella, Harper & Scinto

(57) ABSTRACT

For a multi-terminal semiconductor package, such as a BGA or a CSP, that handles high-speed differential signals, a high-speed signal is assigned to the innermost located electrode pad on an interposer substrate, and the electrode pad is connected to the outermost located ball pad on the interposer substrate. With this arrangement, the length of a plating stub can be considerably reduced, and the adverse affect on a signal waveform can be minimized. This arrangement is especially effective for differential signal lines.

7 Claims, 8 Drawing Sheets

US 7,839,652 B2

SEMICONDUCTOR DEVICE AND PRINTED CIRCUIT BOARD

CROSS REFERENCE TO RELATED APPLICATIONS

This application is a division of U.S. application Ser. No. 11/960,161, filed on Dec. 19, 2007, now U.S. Pat. No. 7,495,928 which is a divisional of U.S. patent application Ser. No. 11/094,136, filed on Mar. 31, 2005 now U.S. Pat. No. 7,349,224. The entire disclosures of these earlier related applications are hereby incorporated by reference herein.

BACKGROUND OF THE INVENTION

1. Field of the Invention

The present invention relates to a semiconductor device on which is mounted a semiconductor element, for transferring a high-speed signal, and a printed circuit board therefor, and particularly to the wiring on a resin substrate (an interposer) of a semiconductor package, such as a BGA or a CSP.

2. Description of the Related Art

Recent electronic apparatuses, such as personal computers, include an I/F such as a USB or an IEEE 1394. The I/F transmits a very high-speed signal having a pulse width that corresponds, after being converted, to a frequency of several hundreds of megahertz. The speed of a signal has been increased even more, and there is a demand for the transmission of a signal that corresponds to a frequency of one gigahertz.

Further, multifunctional ICs and IC modules have been developed that are like system LSI chips, and these ICs are mounted in multi-terminal packages, such as BGAs or CSPs. That is, an IC having a high-speed signal transmission I/F tends to be mounted in a multi-terminal semiconductor package, such as a BGA or a CSP. Generally, in a semiconductor package, a semiconductor element is connected by wire bonding to electrode pads on a resin substrate (an interposer) whereon the semiconductor element is mounted. These electrode pads are connected to the interposer by signal lines extended radially on the interposer. The electrode pads are also connected through vias to ball pads that are provided on the reverse face of the interposer to attach the semiconductor package to a motherboard.

Gold plating is required for the electrode pads on the interposer. In order to perform the gold plating for the electrode pads, the electrode pads must be rendered conductive from the outer edge of the interposer. Therefore, in addition to wiring connected to the mounted semiconductor element, other wiring is extended from the outer edge of the interposer to the individual electrode pads. Wiring extended from an individual electrode pad to the outer edge of the interposer is called a "plating stub". A plating stub has an open end at the outer edge of the interposer, along the transmission line, and the length of the stub is about 1 to 4 mm for a BGA package, of a peripheral type, with 1 mm pitches and four rows.

FIG. 8 is a partial, opened-up view of a semiconductor package employing a conventional BGA, for which, to simplify the explanation, the interior is shown. An interposer substrate 101 in FIG. 8 has a two-layer structure; however, a multi-layer structure of three or more layers may be used. A semiconductor element 110 mounted on the interposer substrate 101 is connected to electrode terminals 103a and 103b on the interposer substrate 101 by wires 102, and the electrode terminals 103a and 103b are connected to electrode pads 105a and 105b by signal lines 104a and 104b. Plating stubs 106a and 106b are extended from the electrode pads 105a and 105b to the outer edge of the interposer substrate 101. The electrode pads 105a and 105b are connected by vias 107a and 107b, which are formed in the interposer substrate 101, to ball pads 108a and 108b on the reverse surface of the interposer substrate 101. The ball pads 108a and 108b are connected by solder balls 109a and 109b to a motherboard (not shown).

Generally, when a period during which a signal reciprocates along a signal line in the open state is longer than the rise time for the signal, a reflected waveform occurs in the signal waveform and causes waveform distortion. For a signal for which the waveform is trapezoidal, the rise time for the signal is generally equal to about 5% of the cycle. Therefore, for a conventionally employed signal having a frequency of 1 GHz, the cycle is about 1.0 nsec and the rise time, which is 5% of the cycle, is 0.050 nsec. Through a calculation performed by employing a signal transfer rate of 6 nsec/m for a common glass epoxy substrate, the equivalent length obtained, for both directions is 8.30 mm, and the wiring length obtained that corresponds to one direction is 4.15 mm. That is, in the open state, a plating stub of about 1 to 4 mm in length does not greatly affect the quality of the waveform.

Furthermore, according to the description in Japanese Patent Laid-Open Publication 2001-110927, ten times the high frequency component of a signal used for a semiconductor element is taken into account, and in the open state, the length of a plating stub is designated as being less than ¼ of the upper limit wavelength in a frequency band (smaller than 3.5 mm for a case wherein the frequency is 1 GHz).

However, the frequency of a signal used for the semiconductor element has been repeatedly increased, and a signal having a frequency even greater than 2 GHz is now employed. For a signal having a frequency of 2 GHz, the cycle is 0.5 nsec and the rise time, which is 5% of the cycle, is 0.025 nsec. Through calculations performed using the signal transfer rate of 6 nsec/m, the equivalent length in both directions is 4.15 mm, and the wiring length corresponding to one direction is 2.08 mm. That is, in the open state, a plating stub of about 2 mm or longer would greatly affect the waveform of a signal to be transmitted.

As is apparent from the conventional semiconductor package shown in FIG. 8, the plating stub 106a extending from the outer electrode pad 105a is short, and the plating stub 106 extending from the inner electrode pad 105b is long. Therefore, in order for the length of the plating stub, for the wiring along which a high-frequency signal is transmitted, to be less than ¼ of the upper limit wavelength for the frequency band, as described in Japanese Patent Laid-Open Publication 2001-110927, the outer electrode pad 105a must be employed as the electrode pad to be connected to the wiring described above.

When there is such a restriction, much of the flexibility of the design of the interposer, and of the motherboard, is lost, and not only are design costs increased, but also, the preparation of a viable design therefor would be impossible.

Further, since recently a differential transmission method is frequently adopted for high-speed signals, differential pair of signal lines for which impedance matching is required must be provided on the interposer. In order to acquire impedance matching for the differential pair of signal lines, a predetermined clearance must be maintained between two signal lines of a differential pair of signal lines. However, it is very difficult, while maintaining this clearance, for the differential pair of signal lines to be passed through a number of electrode pads and connected to the electrode pads nearest the outer edge of the interposer substrate. Therefore, in order to match the differential impedances of the differential pair of signal lines, these wires must be connected to the innermost electrode pads on the interposer, so that the lengths of the plating stubs are increased, and the distortion of waveforms for signals to be transmitted can not be avoided.

SUMMARY OF THE INVENTION

The present invention provides a semiconductor device that reduces high-speed signal waveform distortion, which is due to plating stubs formed on the interposer of a semiconductor package, such as a BGA or a CSP, and a printed circuit board on which this semiconductor device is mounted.

According to this invention, a semiconductor device has a plurality of pads, wherein a first electrode pad is connected to a semiconductor element by a first signal line and is also connected, by a via, to a pad provided on a reverse face of an interposer substrate. A second electrode pad is connected to the first electrode pad by a second signal line and is located nearer an outer edge of the interposer substrate than the first electrode pad that is connected to the pad on the reverse face of the interposer substrate. Also, a third signal line extends from the second electrode pad to the outer edge of the interposer substrate. These electrode pads and the third signal line are formed on the obverse surface of the interposer substrate on which the semiconductor element is mounted.

Further, according to the semiconductor device of the invention, the first electrode pad is the innermost such pad on the interposer substrate, and the second electrode pad is the outermost.

According to the semiconductor device of the invention, the first signal line, the second signal line, and the third signal line are a differential pair of signal lines, for each of which two signal lines are arranged in parallel at a predetermined interval.

According to the semiconductor device of the invention, the length of the third signal line is 2 mm or less.

Furthermore, according to the invention, a printed circuit board is provided on which the semiconductor device is mounted, wherein the first electrode pad is connected to a fourth signal line, on a motherboard, through a via and the pad arranged on the reverse face of the interposer substrate. The second electrode pad is connected to a fifth signal line, on the motherboard, through a via and a pad arranged on the reverse face of the interposer substrate and is also terminated by a terminating resistor.

In addition, according to the invention, a printed circuit board is provided on which the semiconductor device is mounted, wherein the first electrode pad and the second electrode pad are respectively connected, by a fourth signal line on a motherboard, through the vias and the pads arranged on the reverse face of the interposer substrate, and the second electrode pad is further connected to a fifth signal line on the motherboard.

Further features and advantages of the present invention will become apparent from the following description of exemplary embodiments (with reference to the attached drawings).

DESCRIPTION OF THE EMBODIMENTS

The embodiments of the present invention will now be described.

First Embodiment

Figure 1:
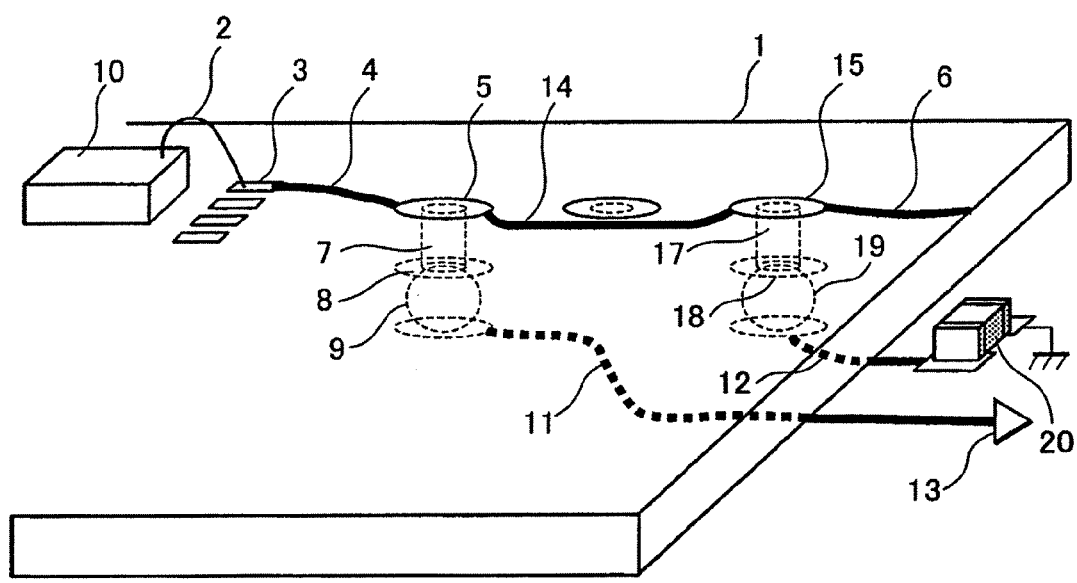
FIG. 1 is a schematic diagram showing a semiconductor device according to a first embodiment of the present invention.

FIG. 1 is a schematic diagram showing a semiconductor package, according to a first embodiment of the present invention, that uses a BGA. A semiconductor element 10, which is mounted on an interposer substrate 1, is connected to an electrode terminal 3 on the interposer substrate 1 by a bonding wire 2. The electrode terminal 3 is connected, by a signal line 4, to an electrode pad 5, the innermost located one, on the obverse surface of the interposer substrate 1. The electrode pad 5 is further. connected to an electrode pad 15, the outermost located one on the obverse surface of the interposer substrate 1, through a signal line 14 that extends across the obverse surface of the interposer substrate 1. A plating stub 6 is so formed that it extends from the electrode pad 15 to the outer edge of the interposer substrate 1. Since the plating stub 6 extends outward from the outermost located electrode pad 15 on the interposer substrate 1, this is a very short line.

The electrode pad 5 is connected to a ball pad 8 on the reverse surface of the interposer substrate 1 by a via 7 formed in the interposer substrate 1. The ball pad 8 is attached to a motherboard by a solder ball 9, and is connected across a signal line 11 to a receiver element 13 on the motherboard. The electrode pad 15 is connected to a ball pad 18 on the reverse surface of the interposer substrate 1 by a via 17 that is formed in the interposer substrate 1. The ball pad 18 is attached to the motherboard by a solder ball 19, and is connected across a signal line 12 to a terminating resistor 20 on the motherboard. In order to acquire a match between the signal line 14 on the interposer substrate 1 and the signal line 12 on the motherboard, the same line impedance must be set for the signal line 14 and the signal line 12, and a signal can be terminated when the resistance of the terminating resistor 20 is set equal to the line impedance.

The semiconductor element 10 and the electrode terminal 3 may be connected by flip chip bonding. Furthermore, in this embodiment, the semiconductor element 10 arranged on the interposer substrate 1 is employed as a driver and the receiver element 12 is arranged on the motherboard; however, the present invention is also effective when the arrangement is reversed.

Further, in this embodiment, on the obverse surface of the interposer substrate 1, the innermost located electrode pad 5 and the outermost located electrode pad 15 are employed. However, the present invention is not limited to this, and so long as a desired length or less can be provided for the plating stub 6, the electrode pad 15 need only be located nearer the outer edge of the interposer substrate 1 than is the electrode pad 5.

Figure 2:
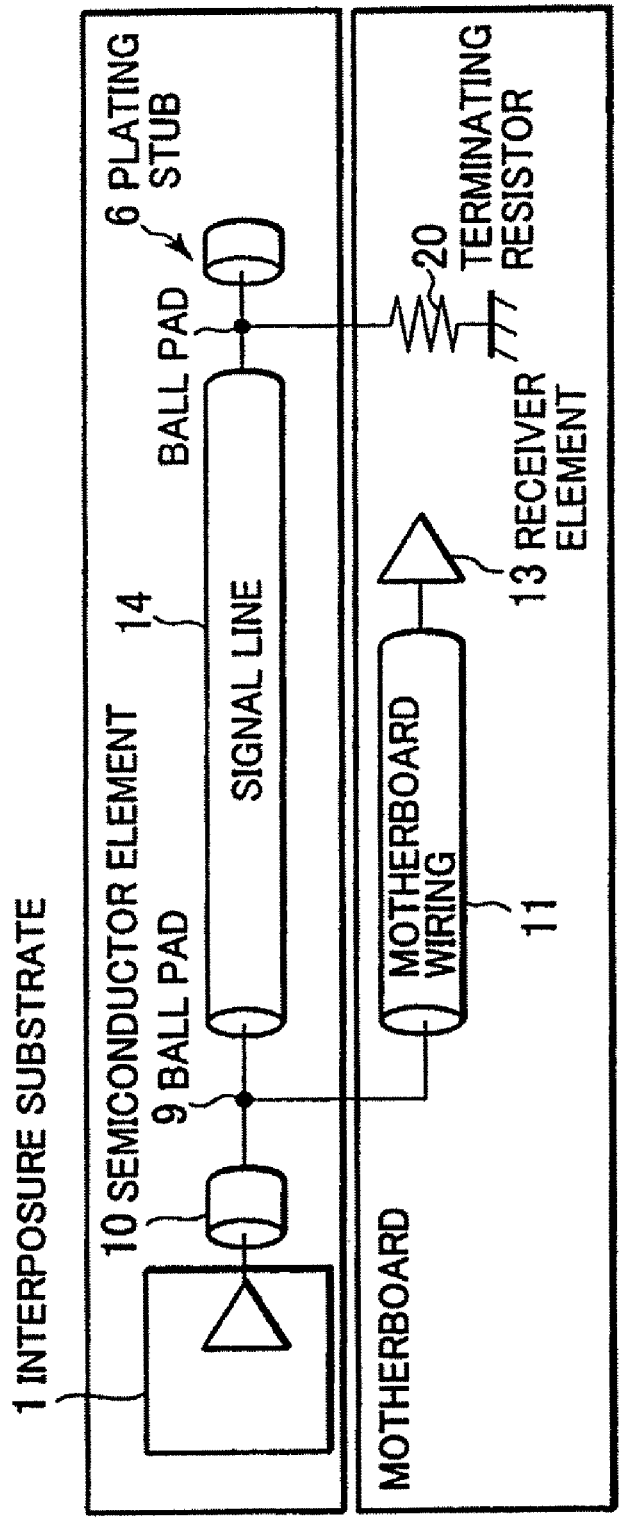
FIG. 2 is a schematic diagram showing a line model for the semiconductor device according to the first embodiment.
Figure 3:
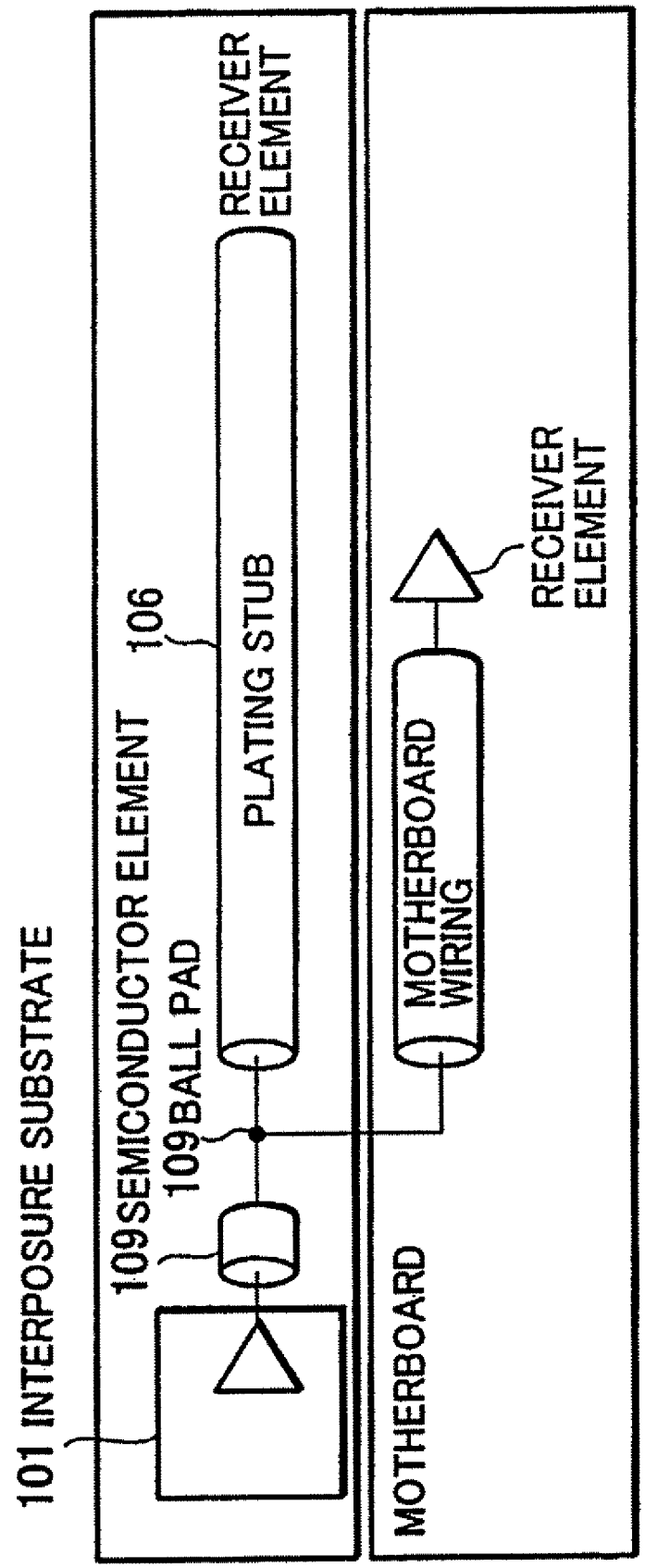
FIG. 3 is a schematic diagram showing a line model for a conventional semiconductor device.
Figure 8:
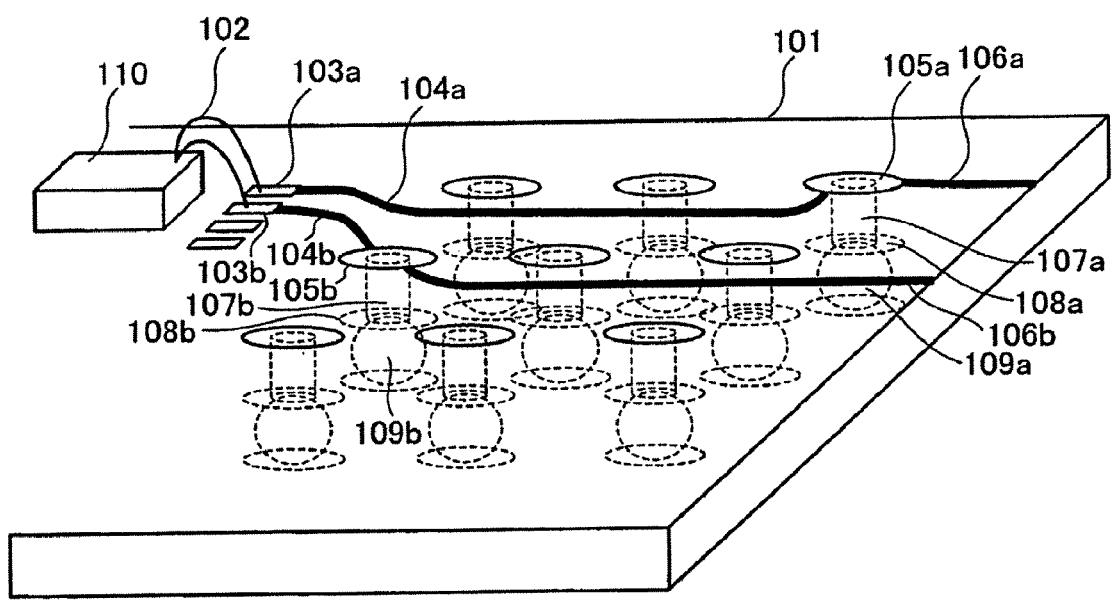
FIG. 8 is a schematic perspective view of a conventional semiconductor device.

A schematic line model for the structure in FIG. 1 is shown in FIG. 2. In FIG. 2, components corresponding to those in FIG. 1 are denoted by the same reference numerals. For comparison, a schematic line model for a conventional structure in FIG. 8 is shown in FIG. 3. As is apparent from FIGS. 2 and 3, the plating stub 6 in FIG. 2 is considerably shorter than a plating stub 106 in FIG. 3.

With this arrangement, the lengths of all plating stubs for transmitting high-speed signals, which has become an issue, can be 2 mm or shorter, and the adverse affect on signal waveforms can be minimized.

Second Embodiment

Figure 4:
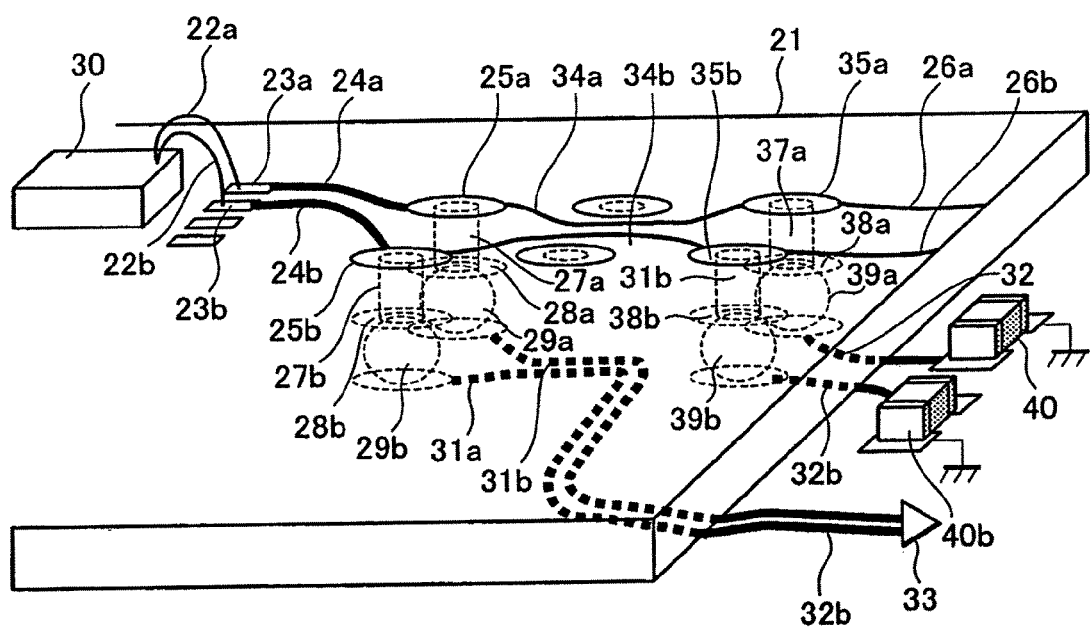
FIG. 4 is a schematic perspective view of a semiconductor device according to a second embodiment of the invention.

FIG. 4 is a schematic diagram showing a semiconductor package, according to a second embodiment of the present invention, that uses a BGA. A semiconductor element 30 is mounted on an interposer substrate 21, and is connected to electrode terminals 23a and 23b on the interposer substrate 21 by wires 22a and 22b. The electrode terminals 23a and 23b are connected by signal lines 24a and 24b to electrode pads 25a and 25b, the innermost located ones on the obverse surface of the interposer substrate 21. Since the signal lines 24a and 24b are differential pair signal lines, the electrode pads 25a and 25b are positioned adjacent to each other, and the signal lines 24a and 24b are extended outward while a predetermined interval is maintained between them.

The electrode pads 25a and 25b are connected to electrode pads 35a and 35b, the outermost located ones on the obverse surface of the interposer substrate 21, by signal lines 34a and 34b extending across the obverse surface of the interposer substrate 21. Plating stubs 26a and 26b are formed so as to extend from the electrode pads 35a and 35b to the outer edge of the interposer substrate 21. Since the plating stubs 26a and 26b extend outward from the outermost located electrode pads 35a and 35b on the interposer substrate 21, these are very short lines. The electrode pads 25a and 25b are connected to ball pads 28a and 28b, arranged on the reverse surface of the interposer substrate 21, by vias 27a and 27b formed in the interposer substrate 21. The ball pads 28a and 28b are attached to a motherboard via solder balls 29a and 29b, and are connected to a receiver element 33 on the motherboard by lines 31a and 31b. The electrode pads 35a and 35b are connected to ball pads 38a and 38b, arranged on the reverse surface of the interposer substrate 21, by vias 37a and 37b that are formed in the interposer substrate 21. The ball pads 38a and 38b are attached to the motherboard via solder balls 39a and 39b, and are connected by lines 32a and 32b to terminating resistors 40a and 40b on the motherboard. In order to acquire a match between the signal lines 34a and 34b on the interposer substrate 21 and the signal lines 32a and 32b on the motherboard, the same line impedance must merely be set for the signal lines 34a and 34b and the signal lines 32a and 32b, and a signal can be terminated when the resistance of the terminating resistor 40 is set equal to the line impedance.

Figure 5:
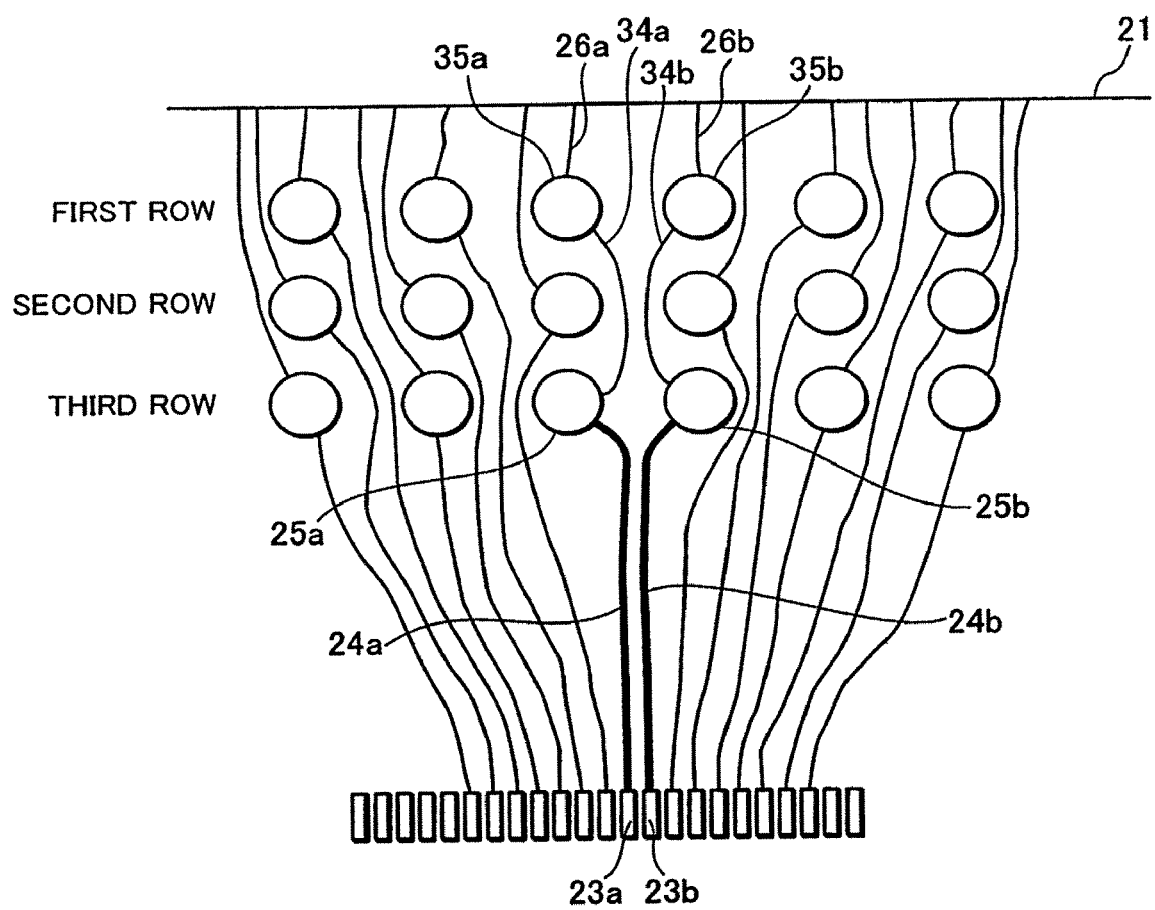
FIG. 5 is a schematic top view of the semiconductor device according to the second embodiment.

FIG. 5 is a schematic top view of the semiconductor package in FIG. 4, and components corresponding to those in FIG. 4 are denoted by using the same reference numerals. As is apparent from FIG. 5, the signal lines 24a and 24b are provided while a predetermined interval is maintained.

With this arrangement, even when the differential lines, for which the differential impedance matching is required, are employed, the length of all the plating stubs for transmitting high-speed signals, which is an issue, can be 2 mm or less, and the adverse affect on the signal waveforms can be minimized.

The present invention can also be applied for a semiconductor package wherein more rows of electrode pads are arranged on an interposer substrate, such as the one shown in FIG. 5 wherein three rows of electrode pads are provided for an interposer substrate. In the second embodiment, the innermost located electrode pads 25a and 25b on the obverse surface of the interposer substrate 21 and the outermost located electrode pads 35a and 35b are employed. However, the present invention is not limited to this, and so long as the length of the plating stubs is a desired length or less, the electrode pads 35a and 35b need only be located nearer the outer edge of the interposer substrate 21 than are the electrode pads 25a and 25b.

Third Embodiment

Figure 6:
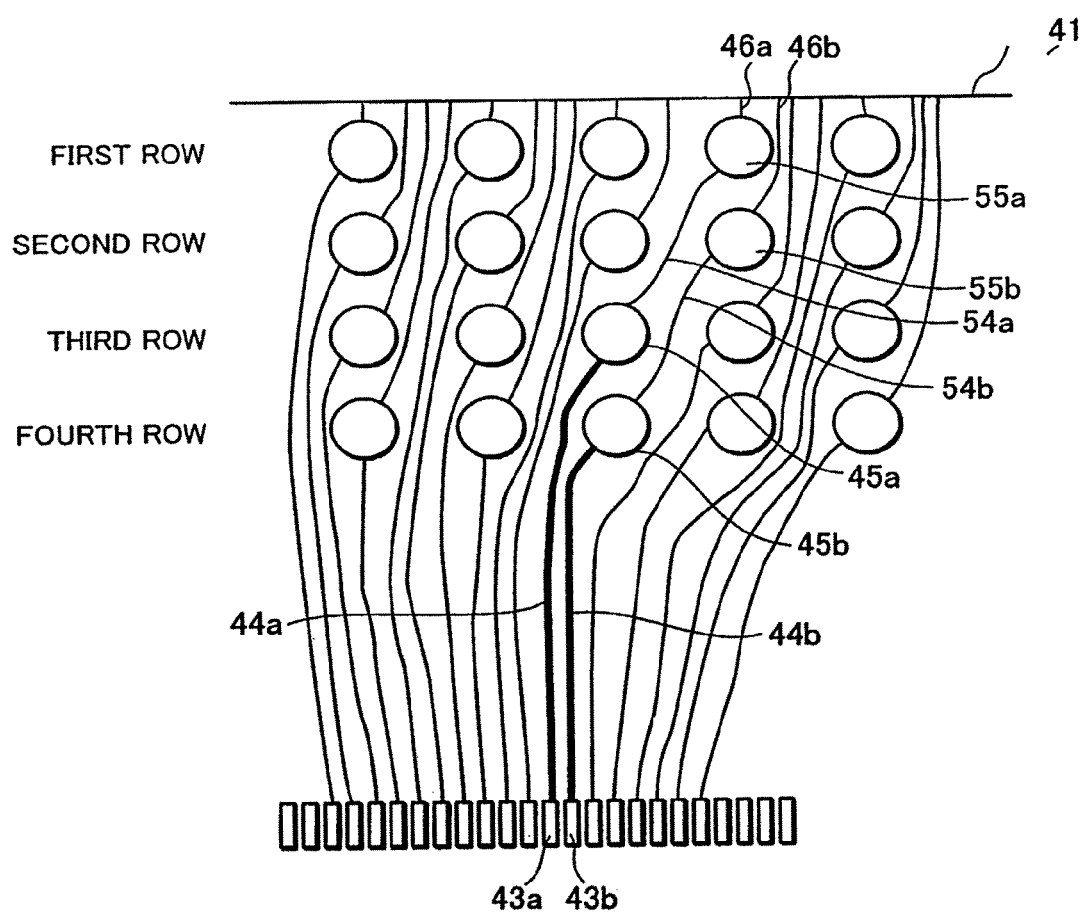
FIG. 6 is a schematic top view of a semiconductor device according to a third embodiment of the present invention.

FIG. 6 is a schematic diagram, according to a third embodiment of the present invention, showing a semiconductor package that uses a BGA. In FIG. 6, as in the second embodiment, a differential pair of signal lines is employed for a semiconductor package that uses a BGA. In the third embodiment, four rows of electrode pads are arranged on an interposer substrate 41.

In FIG. 6, an electrode terminal 43a is connected by a signal line 44a to an electrode pad 25a on the second row from the innermost position on the obverse surface of the interposer substrate 41. An electrode terminal 43b is connected by a signal line 44b to an electrode pad 45b, the innermost located pad on the obverse surface of the interposer substrate 41. Since the signal lines 44a and 44b are a differential pair of signal lines, these lines 44a and 44b are extended outward while a predetermined interval is maintained between them.

An electrode pad 45a is connected by a signal line 54a, provided on the obverse surface of the interposer substrate 41, to an electrode pad 55a, the outermost one on the obverse surface of the interposer substrate 41. An electrode pad 45b is connected by a signal line 54b, provided on the obverse surface of the interposer substrate 41, to an electrode pad 55b in the second row from the outermost location on the obverse surface of the interposer substrate 41. A plating stub 46a extends from the electrode pad 55a to the outer edge of the interposer substrate 41, and a plating stub 46b extends from the electrode pad 55b to the outer edge of the interposer substrate 41.

With this arrangement, the flexibility can be obtained for the positioning of the electrode pads 45a, 45b, 55a and 55b, the line density on the interposer substrate can be reduced, and the design and manufacture can be simplified.

Fourth Embodiment

Figure 7:
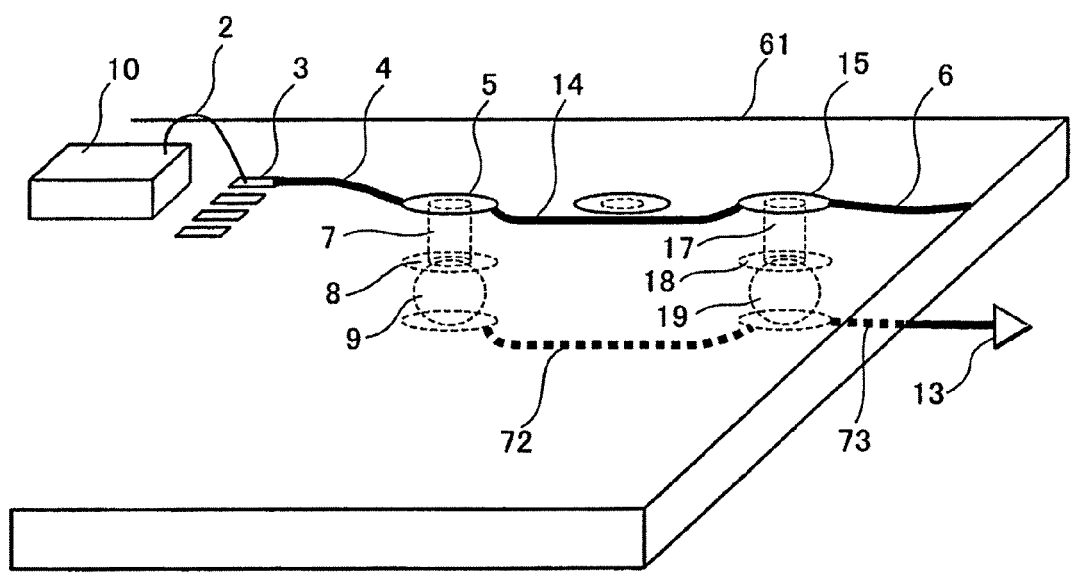
FIG. 7 is a schematic perspective view of a semiconductor device according to a fourth embodiment of the present invention.

FIG. 7 is a schematic diagram showing a semiconductor package, according to a fourth embodiment of the present invention, that uses a BGA. In FIG. 7, the terminating resistor 20, on the motherboard in FIG. 1 for the first embodiment, is removed. The same reference numerals as are used in FIG. 1 are employed to denote corresponding components in FIG. 7, and no further explanation for them will be given.

In FIG. 7, solder balls 9 and 19 are connected by a signal line 72, and solder ball 19 is also connected to a receiver element 13 by a signal line 73.

In order to remove the terminating resistor 20 on the motherboard in the first embodiment, the signal lines extending from the ball pad 9 and the ball pad 19 are also connected on the motherboard. At this time, when the characteristic impedance of a signal line 14 laid on the interposer substrate 61 is equal to the characteristic impedance of the signal line 72 laid on the motherboard, and the lengths of the two lines are equal, these lines can be regarded as a single line having a desired characteristic impedance and are used for signal transmissions. Therefore, a signal transmitted by the ball pad 19 need not be terminated on the motherboard, the arrangement of a terminating resistor is not required, and the adverse affect on a reflected waveform, due to the plating stub, can be reduced.

According to the present invention, for a multi-terminal semiconductor package such as a BGA or a CSP, a high-speed signal is assigned to the innermost located electrode pad on an interposer substrate, and the electrode pad is connected to the outermost located ball pad on the interposer substrate. With this arrangement, the length of the plating stub can be considerably reduced, and the adverse affect on a signal waveform can be minimized.

Further, according to the invention, the line impedance of a signal line, which extends from the outermost located electrode pad through the via, the ball pad and the solder ball and is connected to the motherboard, is terminated by the terminating resistor for which impedance matching is acquired. Therefore, the affect on a waveform due to the plating stub can be even more reduced.

While the present invention has been described with reference to exemplary embodiments, it is to be understood that the invention is not limited to the disclosed embodiments. On the contrary, the invention is intended to cover various modifications and equivalent arrangements included within the spirit and scope of the appended claims. The scope of the following claims is to be accorded the broadest interpretation so as to encompass all such modifications and equivalent structures and functions.

This application claims priority from Japanese Patent Application No. 2004-121434 filed Apr. 16, 2004, which is hereby incorporated by reference herein.

What is claimed is:

1. A semiconductor device, which has a plurality of packaging pads, comprising:
   a semiconductor element; and
   an interposer substrate on which the semiconductor element is mounted,
   wherein the interposer substrate includes:
      a first electrode pad, which is connected to the semiconductor element by a first signal line, and which is also connected, by a via, to a pad provided on a reverse face of the interposer substrate,
      a second electrode pad, which is connected to the first electrode pad by a second signal line, and which is also connected, by a via, to a pad provided on the reverse face of the interposer substrate, and
      a third signal line, which extends from the second electrode pad to the outer edge of the interposer substrate,
   wherein the first and second electrode pads and the third signal line are formed on an obverse surface of the interposer substrate,
   wherein the second electrode pad is located nearer to an outer edge of the interposer substrate than the first electrode pad, and
   wherein the only electrical path from the second electrode pad to the semiconductor element is through the first electrode pad.

2. The semiconductor device according to claim 1, wherein the first electrode pad is located on the interposer substrate inwardly of the second electrode pad.

3. The semiconductor device according to claim 1, wherein each of the first signal line, the second signal line, and the third signal line includes a differential pair of signal lines, and wherein two signal lines of the differential pairs of signal lines are arranged in parallel at a predetermined interval.

4. The semiconductor device according to claim 1, wherein a length of the third signal line is 2 mm or less.

5. A semiconductor circuit assembly, comprising:
   a motherboard; and
   a semiconductor device mounted on the motherboard,
   wherein the semiconductor device includes a semiconductor element and an interposer substrate on which the semiconductor substrate is mounted,
   wherein a first electrode pad is connected to the semiconductor element by a first signal line, a second electrode pad is connected to the first electrode pad by a second signal line and is located nearer to an outer edge of the interposer substrate than the first electrode pad, and a third signal line extends from the second electrode pad to the outer edge of the interposer substrate,
   wherein the first and second electrode pads and the third signal line are formed on an obverse surface of the interposer substrate,
   wherein the first electrode pad is connected to a fourth signal line on the motherboard by a first via to a first reverse pad arranged on the reverse face of the interposer substrate,
   wherein the second electrode pad is connected to the fourth signal line by a second via to a second reverse pad arranged on the reverse face of the interposer substrate, and
   wherein the second electrode pad is connected to a fifth signal line on the motherboard by the second via to the second reverse pad.

6. The semiconductor circuit assembly according to claim 5, wherein the first electrode pad is an innermost located pad provided for the interposer substrate, and the second electrode pad is an outermost located pad on the interposer substrate.

7. The semiconductor circuit assembly according to claim 5, wherein a length of the third signal line is 2 mm or less.

* * * * *